United States Patent [19]

Hall

[11] 4,427,839
[45] Jan. 24, 1984

[54] FACETED LOW ABSORPTANCE SOLAR CELL

[75] Inventor: Robert N. Hall, Schenectady, N.Y.

[73] Assignee: General Electric Company, Schenectady, N.Y.

[21] Appl. No.: 319,824

[22] Filed: Nov. 9, 1981

[51] Int. Cl.³ .................................... H01L 31/06
[52] U.S. Cl. ............................ 136/255; 136/256; 357/30
[58] Field of Search ............... 136/255, 256, 249 MS; 357/30

[56] References Cited

U.S. PATENT DOCUMENTS

| | | | |
|---|---|---|---|
| 3,150,999 | 9/1964 | Rudenberg et al. | 136/256 |
| 4,227,942 | 10/1980 | Hall | 136/255 |
| 4,348,254 | 9/1982 | Lindmayer | 156/647 |

FOREIGN PATENT DOCUMENTS 52-57792 12/1977 Japan .................................. 136/256

*Primary Examiner*—Aaron Weisstuch
*Attorney, Agent, or Firm*—Charles E. Bruzga; James C. Davis, Jr.; Marvin Snyder

[57] ABSTRACT

A solar cell includes a semiconductor wafer of one conductivity type with a front radiation receiving surface having a plurality of pyramidal apertures therein. The spacing of adjacent apertures is selected to maximize the escape of undesired radiation. A material with a high index of refraction fills the apertures and further enhances radiation escape. The surfaces of the wafer are provided with thin regions of opposite conductivity type. Two sets of electrodes are provided at selected locations on the rear side of the wafer. One set of electrodes contacts the region of opposite conductivity type on the rear side. The other set of electrodes contacts the wafer through openings in the region of opposite conductivity type.

12 Claims, 13 Drawing Figures

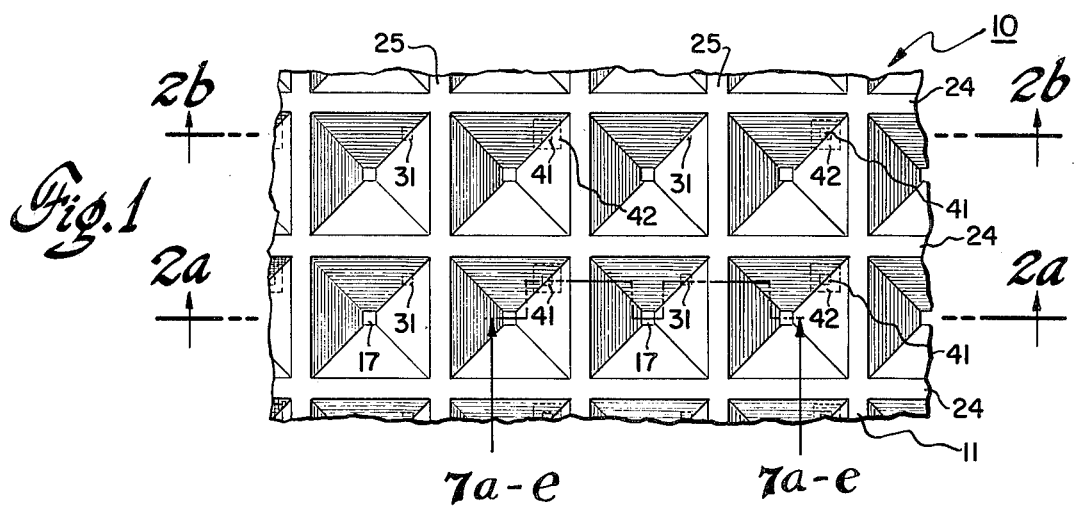
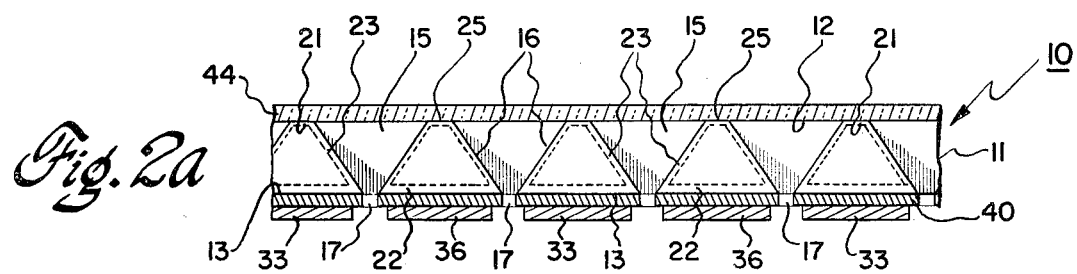
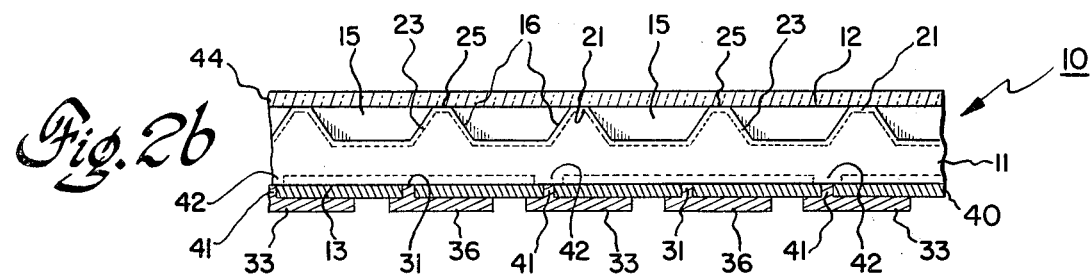
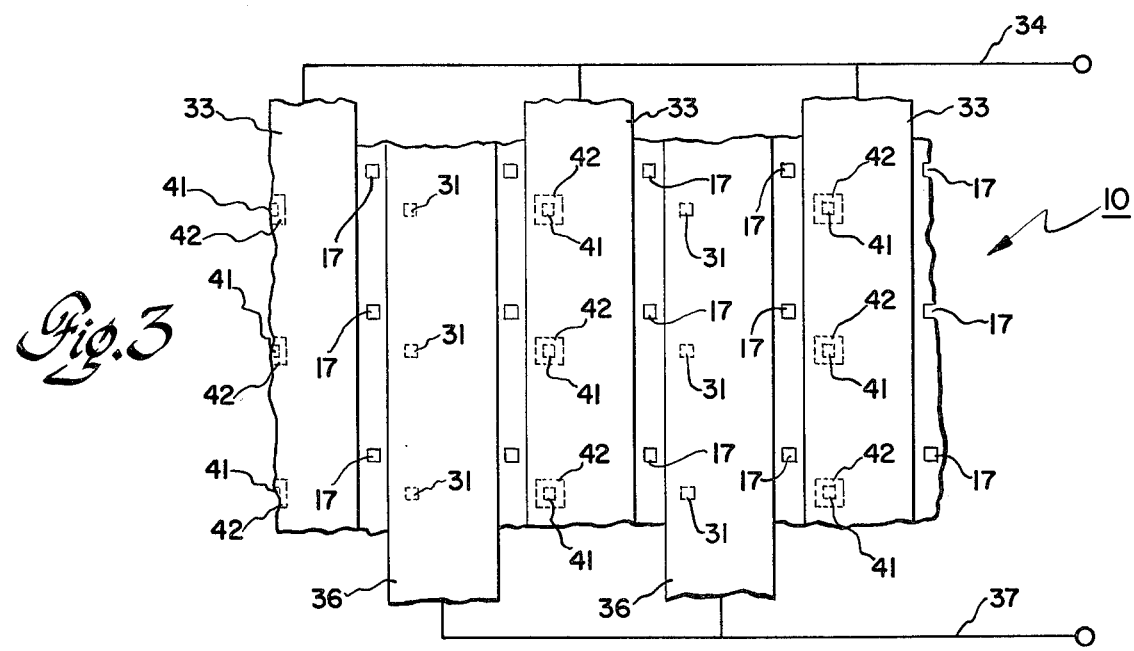

| | |
|---|---|
| FORM OXIDE LAYERS ON EACH SURFACE. PATTERN BACK SURFACE AND REMOVE OXIDE. DIFFUSE PH₃ TO FORM A THICK N⁺ REGION ON BACK SURFACE. | 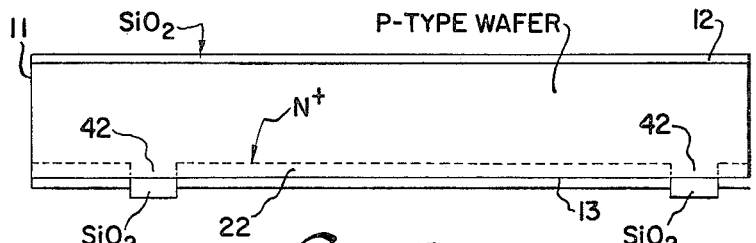 *Fig. 7a* |
| PATTERN BACK SURFACE TO FORM CONTACT OPENINGS AND DIFFUSE BORON TO FORM P⁺ LAYER ON BACK SURFACE. PATTERN APERTURE OPENINGS ON FRONT SURFACE. | 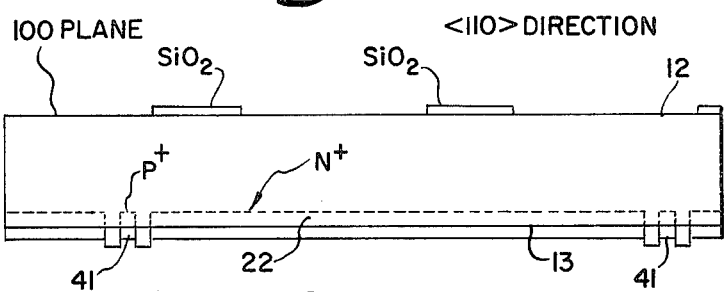 *Fig. 7b* |
| ETCH APERTURES IN FRONT SURFACE. | 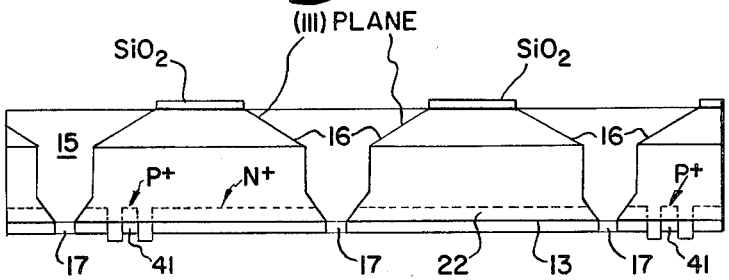 *Fig. 7c* |
| REMOVE REMAINING OXIDE FROM FRONT SURFACE. DIFFUSE PHOSPHORUS INTO EXPOSED WAFER SURFACES TO FORM THIN N⁺ REGIONS. | 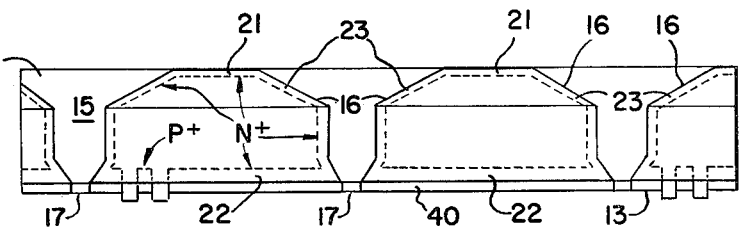 *Fig. 7d* |
| PATTERN BACK SURFACE AND FORM CONTACT OPENINGS. SELECTIVELY EVAPORATE METAL THROUGH MASK ONTO BACK SURFACE TO FORM ELECTRODES. | 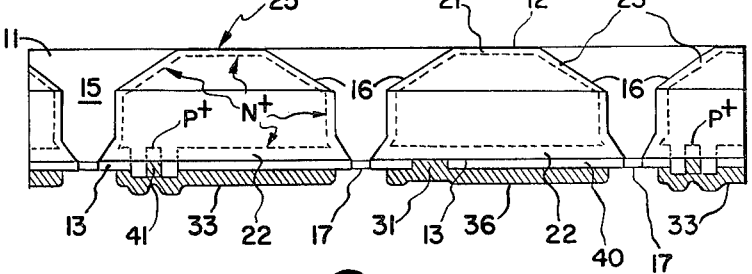 *Fig. 7e* |

*Fig. 6*

FACETED LOW ABSORPTANCE SOLAR CELL

BACKGROUND OF THE INVENTION

The present invention is related to the invention of now abandoned application Ser. No. 229,353, filed Jan. 29, 1981 by the same inventor as herein and assigned to the assignee of the present invention.

The present invention relates to photovoltaic solar cells and specifically to low absorptance solar cells particularly useful in outer space applications.

Silicon solar cells perform most efficiently when operated at low temperatures. Conventional terrestrial solar cells when operated in space are excessively heated by solar radiation trapped in the cell, thereby reducing efficacy. Excessive solar radiation trapping in such cells results from cell ineffectiveness in rejecting the unusable portion of the solar spectrum (long wavelength radiation). The fraction of the solar radiation not rejected is called the absorptance. Absorptance should be made as small as possible while not rejecting the useful portion of the spectrum. Textured front cell surfaces have been found to improve the performance of terrestrial solar cells; such surfaces, however, are not suited for space cells due to increased absorptance. High absorptance in conventional textured cells is due to two factors which are largely eliminated by the present invention. First, in such conventional textured cells the front surface is made up of small irregularly shaped pyramids which lead to diffuse scattering and trapping of radiation by total internal reflection. Secondly, a substantial fraction of the surface area of such conventional cells is covered by optically absorbing electrode metallization which causes the trapped radiation to be absorbed before it is able to escape.

The solar cell of the present invention achieves a low operating temperature by rejecting the long-wavelength portion of the solar spectrum. Special optical features of the cell include a silicon wafer with a front radiation-receiving surface selectively etched to produce facets in the (111) crystalline plane which refract the radiation so that it is totally reflected at the wafer back surface. The reflected radiation is returned to the front surface of an angle which allows its escape therethrough. The radiation which does not escape on the first reflection is favored to escape after further reflections by minimizing the fraction of the silicon wafer surface that is contacted by metal electrodes.

The phenomenon of total reflection of light is important to the operation of the invention. The high index of refraction of silicon makes it difficult for light (infrared radiation) which has entered the silicon to escape again. Only light that strikes the silicon surface at nearly normal incidence is able to escape. If the angle of incidence is greater than 17° from perpendicular, light is totally reflected without any absorption loss. This condition is achieved in the present invention by providing faceted areas which refract the light as it enters the silicon such that it is totally reflected from the back surface and directed back to the front surface where it impinges at nearly normal incidence and can then escape. Light that arrives at non-faceted areas of the cell is reflected at the back surface by an oxide layer covered with silver which provides efficient metallic reflection and sends the light back out the front surface again with negligible absorption loss.

SUMMARY OF THE INVENTION

In an embodiment of the present invention there is provided a body of cubic symmetry monocrystalline semiconductor material of one conductivity type having a pair of opposite parallel major surfaces, each parallel to a (100) crystallographic plane of the body. A plurality of apertures are provided in the body, each extending from one of the major surfaces a uniform distance into the body. The apertures are in the form of quadrangular pyramids with the bases of the pyramids coplanar with the one major surface. Each of the sides (facets) of the apertures is parallel to a (111) plane of the body. The separation between adjacent apertures is chosen so that only one-fourth of the radiation entering through the faceted areas will be trapped in the cell. The apertures are filled with a material having a high index of refraction which further enhances radiation escape. A first thin region of the opposite conductivity type is provided in the body along the aforementioned one major surface which is also referred to as the front surface. A second thin region of the opposite conductivity type is provided in the body along the other major surface also referred to as the back surface. The second thin region of opposite conductivity type has openings therein exposing portions of the body which constitutes a substrate of the one conductivity type. A plurality of the third thin regions of opposite conductivity type are provided in the body along each of the sides of the apertures. Each of the third thin regions contacts the first and second regions. A first conductive connection is provided to the exposed portions of the substrate. A second conductive connection is provided to the second thin region of opposite conductivity type.

An object of the present invention is to provide a photovoltaic solar cell having improved efficiency of converting optical radiation into electrical energy.

Another object of the invention is to a provide low absorptance solar cell particularly useful in applications outside the earth's atmosphere.

BRIEF DESCRIPTION OF THE DRAWINGS

The features of the invention believed to be novel are set forth with particularity in the appended claims. The invention itself, however, both as to its organization and method of operation, together with further objects and advantages thereof, may best be understood by reference to the following description taken in conjunction with the accompanying drawings in which:

FIG. 1 is a top plan view of a photovoltaic semiconductor device in accordance with an embodiment of the present invention showing the front side thereof.

FIG. 2a is a sectional view of the device of FIG. 1 taken along section line 2a—2a showing the internal structure thereof.

FIG. 2b is a sectional view of the device of FIG. 1 taken along section line 2b—2b further illustrating the internal structure thereof.

FIG. 3 is a bottom plan view of the device of FIG. 1 showing the rear side thereof.

FIG. 6 is a flow diagram of a method of fabricating the device of FIGS. 1–3 in accordance with the present invention.

FIGS. 7a–7e are enlarged sectional views of the device of FIG. 1 taken along section line 7a-e—7a-e while in the process of fabrication in accordance with the method of the flow diagram of FIG. 6.

DETAILED DESCRIPTION OF THE INVENTION

Figure 4A:
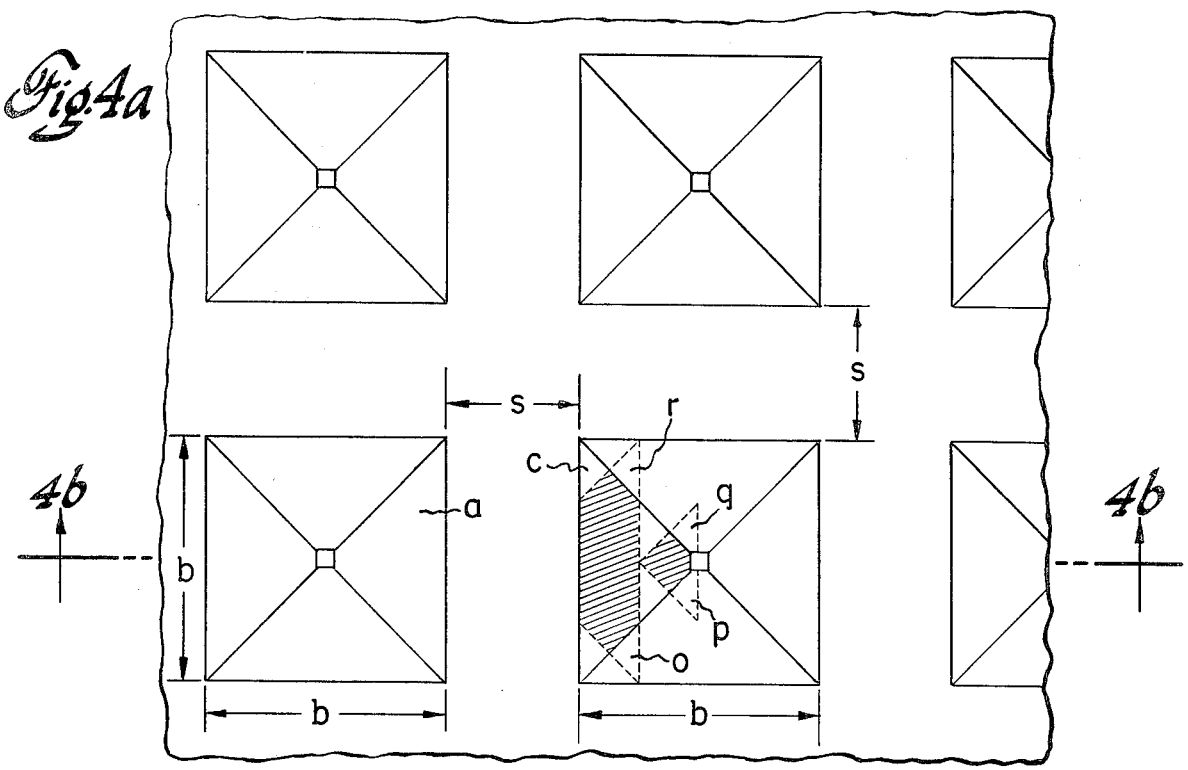
FIGS. 4a and 4b show top and cross-sectional views of the inventive solar cell, respectively, illustrating radiation paths in the cell.

Referring to FIGS. 1, 2a, 2b, and 3 there is shown a photovoltaic semiconductor device 10 embodying the present invention. The device includes a body 11 or wafer of monocrystalline silicon semiconductor material of P-type conductivity, for example, with a resistivity of 0.3 ohm-cm. Body 11 includes a pair of opposite parallel major surfaces 12 and 13, each parallel to a (100) crystallographic plane of the body. Surface 12 will be referred to as the front or light-receiving surface and surface 13 will be conveniently referred to as the back surface to which electrical connections will be made. A plurality of apertures 15 are provided in body 11 each extending from the major surface 12 through to the opposite major surface 13. Each of the apertures has four sides (facets) 16 of identical outline constituting the sides of a truncated quadrangular pyramid. The base of the pyramid is coplanar with the major surface 12 and the truncated apex of the pyramid is coplanar with surface 13. Thus, each of apertures 15 has a large opening in the plane of the major surface 12 and a small opening 17 in the plane of surface 13. A first thin region 21 of N-type conductivity is formed adjacent the major surface 12 of the body. A second thin region 22, deeper than region 21, of N-type conductivity is formed in the body adjacent major surface 13. A plurality of third thin regions 23 of N-type conductivity ar formed, each adjacent the sides 16 of apertures 15. Each of the third thin regions 23 contacts both the first thin region 21 and the second thin region 22. A quartz or ceria glass cover-slip 44 is placed on front surface 12 and covers apertures 15.

Body 11 of P-type silicon semiconductor material may be doped with boron and have a concentration of activtor atoms of about $10^{17}$ atoms per cubic centimeter, providing a resistivity of about 0.3 ohm-cm. The first, second, and third regions 21, 22, and 23, respectively, of N-type conductivity may have a net activator concentration at the surface regions thereof of about $10^{20}$ atoms of phosphorous per cubic centimeter providing a resistivity of about 0.001 ohm-cm. The thickness of each of the first regions 21 and the third thin regions 23 is preferably less than approximately 0.3 micron to enable a substantial portion of incident radiation to penetrate beyond the PN-junction formed adjacent the surfaces thereof and be absorbed in body 11. Most of the radiation is absorbed in the vicinity of the third thin regions 23 and the resulting photocurrent flows within regions 23 parallel to the surface 16 on its way to electrode 36. In doing so it suffers electrical loss determined by the series resistance of regions 23 which depends upon the resistivity of third thin regions 23 and their thicknesses, and upon the length of the current flow paths each of which is slightly larger than the thickness of body 11. To lower the series resistance it is desirable to decrease the resistivity and increase the thickness of the third thin regions. However, such steps increase the absorption of radiation therein and also reduce the lifetime of minority carriers therein and thus result in reducing the efficiency of conversion of incident radiation into electrical output. The resistivity of the first and third thin regions is selected with attention to these considerations in accord with well-established solar cell technology. The second thin region of N-type conductivity preferably is substantially thicker, for example, of the order of 1 to 4 microns to provide low resistance and sufficient depth to enable metallic films or layers to be bonded thereto without destroying the integrity of the PN-junctions they form with body 11 of P-type conductivity.

Apertures 15 in the front or light-receiving surface are shown organized in a regular pattern consisting of rows and columns, adjacent rows being separated by a horizontal ridge 24 and adjacent columns being separated by a vertical ridge 25. In the plane of front surface 12, apertures 15 appear as squares. The squares in a row are preferably equally spaced and also the squares in a column are preferably equally spaced.

A plurality of quadrangular contact openings 31 are provided in a region of a dielectric layer 40 (typically $SiO_2$) underlying the junction of two adjacent (111) facets 16 to expose second thin region 22 of opposite conductivity type. Openings 31 are provided under apertures 15 forming one set of columns which alternate with a second set of columns that are contacted through a plurality of similar openings 41 in dielectric layer 40 exposing wafer material of one conductivity type.

Figure 4B:
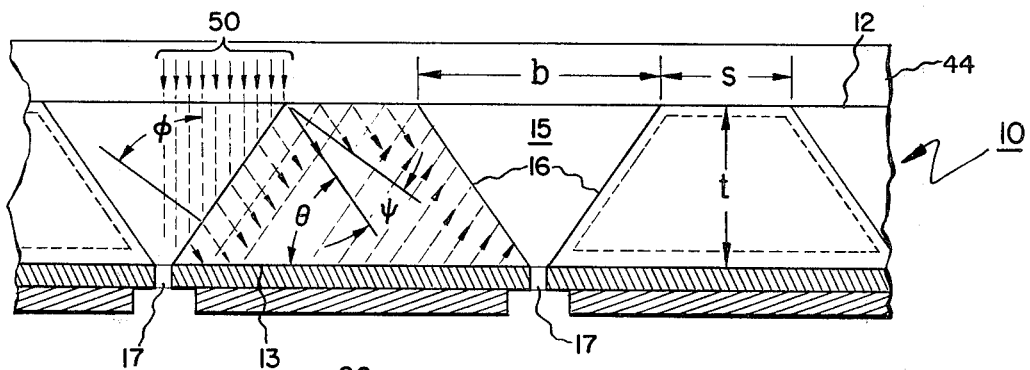

Openings 31 and 41 are located near one or more of the corners of each aperture 15 so they do not intercept the radiation falling on facets 16 and which is refracted along the light paths illustrated in FIGS. 4a and 4b. Openings 31 and 41 should be preferably situated under their respective apertures 15 a distance b/8 (b being the length of a side of aperture 15 as indicated in FIG. 4a) in both directions from the corner of the aperture openings and positioned below the junction of adjacent aperture facets since this region is not exposed to impinging solar radiation. This has the effect of further minimizing absorption of undesirable radiation by the metallized electrode areas.

A metallic ribbon electrode 36, typically silver, is applied over dielectric layer 40 so that it makes contact with second thin region 22 through contact openings 31. The electrode thus interconnects the second thin region 22 of each cell in a column. As is evident, only a small portion of the electrode thus contacts the second thin region. The major fraction of the metallic electrode covers the dielectric layer, leaving a reflective boundary at the interface. In this manner, since ohmic contacts are optically absorbing, the electrode contact area is minimized to reduce the absorption of trapped radiation. Metallic electrodes 36 are connected to a first terminal 37 of the solar cell, as shown in FIG. 3.

In the alternate columns of apertures, openings are provided in second thin regions 22 to expose regions 42 of material of one conductivity type. Each of regions 42 is situated over a contact opening 41 which is provided in a region of dielectric layer 40 underlying the junction of adjacent (111) facets 16. Metallic electrodes 33, similar to electrodes 36, interconnect regions 42 of each cell in an alternate column. Electrodes 33 are connected to a second terminal 34 of the solar cell, as shown in FIG. 3.

Reference is now made to FIGS. 4a and 4b which illustrate radiation paths in the inventive solar cell and with reference to which the advantages of the inventive cell may be best appreciated. FIG. 4b is a sectional view of the solar cell taken along line 4b—4b in FIG. 4a which shows the top view. An important element of the inventive solar cell is the selection of the separation between adjacent apertures 15 in a row and the identical separation between adjacent apertures in a column. The separation s is chosen to minimize the reflection from unfavorably oriented facets 16. Rays 50, perpendicular to the plane of front cell surface 12 enter through a facet with an angle of incidence of $\phi = 54.74°$. The rays are then refracted to a new angle of incidence within the silicon, $\psi$, which is smaller than $\phi$ because of the high index of refraction of silicon wafer 11. In the silicon, the rays travel to the back surface 13 where they are totally reflected and returned to the front where they will either strike the wafer front surface 12 or another facet 16. Rays striking facet 16 arrive at the same angle of incidence $\psi$ and will therefore be within the range of angles that permit radiation to escape. There will be partial reflection at facet 16 which is minimized if a high index of refraction material fills apertures 15. Rays striking front wafer surface 12 will be totally reflected there and again at the back surface 13 and may have another opportunity to strike a favorably oriented facet 16 and escape. Those rays which do not escape are eventually absorbed.

It has been determined that reflections from unfavorably oriented facets 16 are minimized when $s = (3t/2) \cot \nu - b/4$, where b is the length of the side of the aperture, and t is the thickness of wafer 11, and $\theta$ is the propagation angle of rays that have entered the wafer through a facet 16. The crystal planes of silicon determine that $t = b\sqrt{2}$ and the angle $\phi = \cos^{-1}(1/\sqrt{3}) = 54.74°$. Angle $\theta = 90° - \phi + \psi$, and angle $\psi = \sin^{-1}((n_2/n_1) \sin \phi)$, where $n_2$ is the index of refraction of the material used to fill apertures 15 and $n_1$ is the index of refraction of silicon (3.4). Selection of spacing "s" in accordance with the aforedescribed criteria causes 75 percent of a light beam that enters through facet "a" in FIG. 4a, to strike favorably oriented face "c" of the adjoining indentation, either on the first reflection or after two more internal reflections. The shaded area in facet "c," FIG. 4a, indicates the escaping rays. The remaining 25 percent of the light beam strikes unfavorably oriented facet portions identified by triangles o, p, q, and r.

Figure 5:
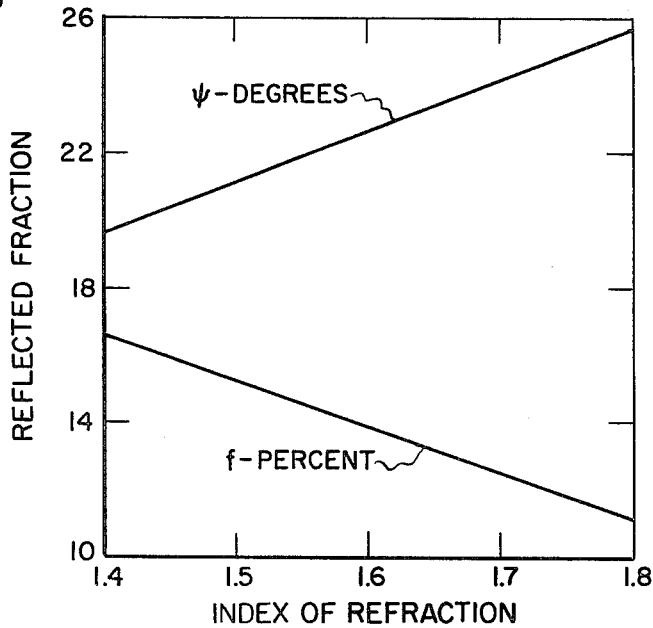
FIG. 5 is a graphical illustration showing how the fraction of light reflected from an internal face of an aperture and the incident angle within the cell body depend on the index of refraction of the material filling the apertures.

The principal variable that can be adjusted to minimize the partial reflection from (111) facets 16 in $n_2$, the index of refraction of the material filling apertures 15. As the index of refraction $n_2$ is increased, angle $\psi$ increases, and the reflection coefficient at the (111) facets 16 decreases. This dependence of angle $\psi$ on $n_2$ is graphically illustrated in FIG. 5, taking into account the polarization that occurs as the ray first enters the silicon. Index of refraction $n_2$ is shown on the horizontal axis, while the fraction "f" of light inside the silicon that is reflected back on striking (111) facet 16 is shown on the vertical axis. In the case where $n_2 = 1.44$, which is typical of many transparent plastics, the angle of incidence $\psi$ is approximately 20.2°, and the reflection is only 16 percent which corresponds to low absorptivity. Larger values of $n_2$ would result in even larger incident angles and less reflection, but materials with indexes of refraction greater than about 1.7 are difficult to find. Suitable materials for filling apertures 15 include an epoxy composition identified as EPO-TEK 301, index of refraction 1.564, available from Epoxy Technology, Inc. (Billerica, Mass.), and transparent silicone rubber, index of refraction 1.406, identified as RTV 619 which is available from the Silicone Products Division of the General Electric Company (Waterford, N.Y.).

It will be appreciated that efficient reflection of light entering the cell through apertures 15 at the back surface 13 of the silicon does not depend upon having metal over the dielectric layer, but is achieved by total reflection independent of whether metal is present or not. However, light that strikes the cell in the unfaceted areas 24 and 25 arrives at the back of the cell at normal incidence. The areas of the back surface directly under areas 24 and 25 are provided with dielectric layer 40, most of which is covered with metallic electrode layers 33 and 36 which are made highly reflective, for example, by being covered with silver. Only the narrow gap which separates electrodes 33 and 36 from each other is unsilvered.

Reference is now made to FIGS. 6 and 7a–7e which illustrate a method of fabrication of the device of FIGS. 1–3 to provide a solar cell constituted of a body of P-type conductivity. A piece of monocrystalline silicon is cut from an ingot of P-type conductivity to provide a wafer 11 having a pair of opposite parallel major surfaces, each parallel to a (100) crystallographic plane of the wafer. The ingot of P-type conductivity has been doped with a suitable doping agent such as boron to provide a suitable resistivity to the wafer, for example 0.3 ohms-cm. The major surfaces of the wafer are etched and polished to provide a wafer about 4 mils thick with a pair of smooth planar surfaces 12 and 13. The wafer is oxidized in steam at 900° C. for four hours to produce a silicon oxide ($SiO_2$) layer 0.2 microns thick. Using conventional silicon processing technology, the back surface 13 is patterned using a suitable mask and oxide is removed from the back except where region 42 is to be formed. The wafer is then exposed to phosphine ($PH_3$) at a temperature of 875° C. for 10 hours to cause phosphorous to be diffused into the exposed surfaces to a depth of about 1 to 2 microns to produce thin layers 22 of N+ conductivity, and leaving a layer of phosphorous doped glass over the back surface, as shown in FIG. 7a. The back surface is again patterned to make openings corresponding to contact openings 41 and boron is diffused in to form thin P+ layers where metallic electrodes 33 are to be deposited.

The $SiO_2$ layer on front surface 12 is next patterned to expose silicon in the areas where apertures 15 are required, therein exposing the major surface 12 (FIG. 7b). The square openings are arranged into columns and rows. Both the column axis and the row axis of the square openings are aligned parallel to (110) crystallographic directions of the wafer 11 in the surface 12. The squares of adjacent rows and columns are separated by a distance s of approximately 2.5 mils, as heretofore described. For a wafer 4 mils in thickness the sides of the square openings are made 6 mils wide so that when the wafer is anisotropically etched, as will be described below, an aperture 15 of pyramidal outline extending to the opposite major surface 13 will be formed at each of the square openings. Sides 16 of the aperture are parallel to (111) planes of the wafer. The (111) are oriented at an angle 54.74 degrees with respect to the surface 12. The wafer is cemented to a glass slide using polystyrene cement to protect the back surface and immersed in a solution of 38 weight percent KOH in water at 30° C. to etch recesses 16 through the wafer (FIG. 7c). Apertures 15, formed by the etching action, extend to the opposite surface 13. The apertures are in the form of quadrangular pyramids, the bases of which are squares in the surface 12 as shown in FIG. 1. Following this, the remaining $SiO_2$ is etched from the front using buffered HF.

After cleaning of the wafer, phosphorus is diffused into the exposed surfaces thereof from a phosphine source at a temperature of 875° C. and for a time of 20 minutes to form thin layer of N+ conductivity about 0.2 micron thick, corresponding to the first thin layer 21 and the third thin layers 23, as shown in FIG. 7d. The back is again patterned and openings corresponding to contact openings 31 and 41 are made in the doped oxide glass left by the boron and phosphorous diffusions performed earlier, exposing the silicon surface. A first shadow mask is provided having openings through which metal can be evaporated upon the openings 31 and 41. The mask is situated in register with these openings and placed in a vacuum system where in sequence thin layers of titanium and palladium are evaporated, forming electrical contacts to the silicon. Then a second shadow mask is provided having elongated openings through which metal can be evaporated to form the interdigitated sets of elongated electrodes 33 and 36, and placed in register with openings 31 and 41 in a vacuum system and silver is evaporated through the shadow mask onto the elongated openings in the layer of silicon dioxide to form the electrodes 33 and 36, as shown in FIG. 7e. Thereafter, a suitable cleaning etch is used to remove any shunt leakage paths. A suitable antireflective coating may be applied to the front or light receiving surfaces of the wafer. Cover slip 44 is attached using a transparent bonding medium which fills apertures 15 after which the wafer is ready for mounting in a suitable receptacle.

In the devices described in connection with FIGS. 1–3, apertures 15 have square openings in the plane of major surface 12; however, rectangular openings could have been utilized, if desired, to provide pyramidal apertures with rectangular bases. With rectangular apertures, the spacing, s, between apertures is again determined by the formula $s=(3t/2)\cot\theta - b/4$, where b is the length of the smaller of the two sides of the rectangular apertures. Also, while the square openings were produced with etch masks having square openings, they could as well have been produced with etch masks with circular openings. In the latter case anisotropic etching would cause etching to occur with respect to each circular opening over a surface region bounded by square openings having sides parallel to 110 directions in which the circular opening is inscribed. The resultant aperture would be a quadrangular pyramid with each of the sides thereof parallel to a (111) plane of the semiconductor material. Additionally, although in the device of FIGS. 1, 2, and 3, several apertures have been shown, as many apertures as desired may be included extending in both the row and column directions limited only by the size of the wafer on which such apertures are formed.

In the devices described in connection with FIGS. 1–3 the apertures 15 extend from one major surface 12 to the other major surface 13. However, if desired, the apertures 15 could extend to a point just short of the other major surface 13, provided thin regions 22 and 23 overlap so electrical contact is obtained.

The invention has been illustrated in connection with devices using silicon semiconductor material, but other monocrystalline semiconductor materials of cubic symmetry, such as germanium, may be utilized in accordance with the present invention. The utilization of such material would require alteration in the details of the steps of fabrication of devices of these semiconductor materials in accordance with their respective technologies. Similarly, although the device has been illustrated in connection with a body or wafer of semiconductor material of P-type conductivity, it will be understood that N-type semiconductor material may also be used. Use of such material would, of course, require the first, second, and third thin regions to be of P-type conductivity.

The foregoing describes a photovoltaic cell having improved efficiency for converting optical radiation to electrical energy. The cell is of low absorptance, making it useful in applications outside the earth's atmosphere.

While certain preferred features of the invention have been shown by way of illustration, many modifications and changes will occur to those skilled in the art. It is, therefore, to be understood that the appended claims are intended to cover all such modifications and changes as fall within the true spirit of the invention.

The invention claimed is:

1. A photovoltaic device comprising: a body of cubic symmetry monocrystalline semiconductor material of one conductivity type having a upper and lower opposite parallel major surfaces, each parallel to a (100) crystallographic plane of said body;

a plurality of recesses arranged in equally spaced rows and columns in said body, each of said recesses being in the form of a quadrangular pyramid with the base of the pyramid coplanar with said upper major surface and extending a uniform distance into said body, each of the sides of the recesses being parallel to a (111) plane of said body of monocrystalline semiconductor material, the bases of adjacent pyramids being separated by a distance s defined by the relation $s=3t/2\ (\cot\theta - b/4)$, wherein t is the separation of said upper and lower parallel major surfaces, b is the length of a side of the pyramind base, and $\theta$ is the propagation angle of light that has entered the semicondutor through the (111) surfaces of the apertures;

a first thin region of opposite conductivity type in said body along said upper major surface of said body;

a second thin region of opposite conductivity type in said body along said lower major surface of said body, said second thin region of opposite conductivity type having openings therein exposing portions of said body of said one conductivity type;

a plurality of third thin regions of opposite conductivity type, each in said body along the sides of said recesses, each of said third thin regions contacting said first and second thin regions;

a dielectric layer disposed on said lower major surface of said body, said dielectric layer having a first plurality of openings under said recesses and exposing said portions of said body of said one conductivity type, said dielectric layer having a second plurality of openings under said recesses and exposing said second thin region of opposite conductivity type;

a first means positioned on said dielectric layer for making conductive connections to said exposed portions of said body; and a second means positioned on said dielectric layer for making conductive connections to said second thin region of opposite conductivity type.

2. The device of claim 1 wherein said first and second means for making conductive connections, which are positioned on said dielectric layer, form therewith a highly reflective contact region.

3. The device of claim 2 wherein the conductive connections to the exposed portions of said body and to said second thin region of opposite conductivity type are located under a corner of the base of each of said quadrangular pyramids.

4. The device of claim 3 wherein the conductive connections to the exposed portions of said body and to said second thin region of opposite conductivity type are located a distance b/8 from each of the sides forming a corner of the base of each of said quandrangular pyramids.

5. The device of claim 3 in which said cubic symmetry monocrystalline semiconductor material is selected from the group consisting of silicon and germanium.

6. The device of claim 5 in which said monocrystalline cubic symmetry semiconductor material comprises silicon.

7. The device of claim 1 in which each of said recesses extends from said upper major surface to said lower major surface.

8. The device of claim 1 in which said recesses are filled with a material having a high index of refraction.

9. The device of claim 1 in which the base of each of said quadrangular pyramids is in the shape of a square.

10. The device of claim 1 in which each of said first and third thin regions is less than about 0.3 micron thick.

11. The device of claim 1 in which said second thin region of opposite conductivity type is thicker than said first and third thin regions of opposite conductivity type.

12. The device of claim 1 in which the base of each of said quadrangular pyramids is in the shape of a rectangle, and wherein b is the length of the smaller of the rectangle sides.

* * * * *